(12) United States Patent
Hong et al.

(10) Patent No.: US 11,555,836 B2
(45) Date of Patent: Jan. 17, 2023

(54) APPARATUS AND A METHOD OF CURRENT MEASUREMENT WITH COMPENSATION CAPABILITY BASED ON SYSTEM INFORMATION

(71) Applicant: ITX-M2M CO., LTD., Seoul (KR)

(72) Inventors: Ki Chul Hong, Yongin-si (KR); Ki Seok Kim, Yongin-si (KR)

(73) Assignee: ELEXSEN CORP., Yongin-si (KR)

( * ) Notice: Subject to any disclaimer, the term of this patent is extended or adjusted under 35 U.S.C. 154(b) by 441 days.

(21) Appl. No.: 16/693,168

(22) Filed: Nov. 22, 2019

(65) Prior Publication Data

US 2020/0166549 A1   May 28, 2020

(30) Foreign Application Priority Data

Nov. 22, 2018 (KR) .................. 10-2018-0145769

(51) Int. Cl.
*H02P 27/06* (2006.01)
*G01R 19/25* (2006.01)
*G01R 15/20* (2006.01)

(52) U.S. Cl.
CPC ....... *G01R 19/2506* (2013.01); *G01R 15/202* (2013.01); *H02P 27/06* (2013.01)

(58) Field of Classification Search
CPC .... G01R 19/2506; G01R 15/202; H02P 27/06
See application file for complete search history.

(56) References Cited

U.S. PATENT DOCUMENTS

| | | | |
|---|---|---|---|
| 6,750,644 B1 * | 6/2004 | Berkcan | G01R 33/02 324/529 |
| 2006/0232902 A1 * | 10/2006 | Woolsey | G01R 15/202 361/93.1 |
| 2015/0219692 A1 * | 8/2015 | Krah | G01R 33/0029 324/117 H |
| 2016/0261213 A1 * | 9/2016 | Garcha | H02K 11/27 |
| 2017/0082661 A1 * | 3/2017 | Schulz | G01R 15/207 |

\* cited by examiner

*Primary Examiner* — Rina I Duda
(74) *Attorney, Agent, or Firm* — McCoy Russell LLP (57) ABSTRACT

A current measurement apparatus includes: a current sensing element generating a signal according to a current to be measured; a current measurement means measuring an amount of the current to be measured from the signal outputted from the current sensing element; a communication unit receiving system information from at least one upper-level controller; a correction amount calculation unit calculating information on an amount of a corrected current based on the amount of the current to be measured and the system information; and a measurement operation unit outputting the information on the amount of the corrected current to the at least one upper-level controller.

13 Claims, 6 Drawing Sheets

APPARATUS AND A METHOD OF CURRENT MEASUREMENT WITH COMPENSATION CAPABILITY BASED ON SYSTEM INFORMATION

CROSS-REFERENCE TO RELATED APPLICATIONS

The present application claims priority to Korean Patent Application No. 10-2018-0145769 filed on Nov. 22, 2018. The entire contents of the above-listed application is hereby incorporated by reference for all purposes.

TECHNICAL FIELD

The following disclosure relates to a field of a current sensor, and more particularly, to a current measurement apparatus and method having a function to correct a current measurement error using system information of upper-level controllers.

BACKGROUND

Figure 1:
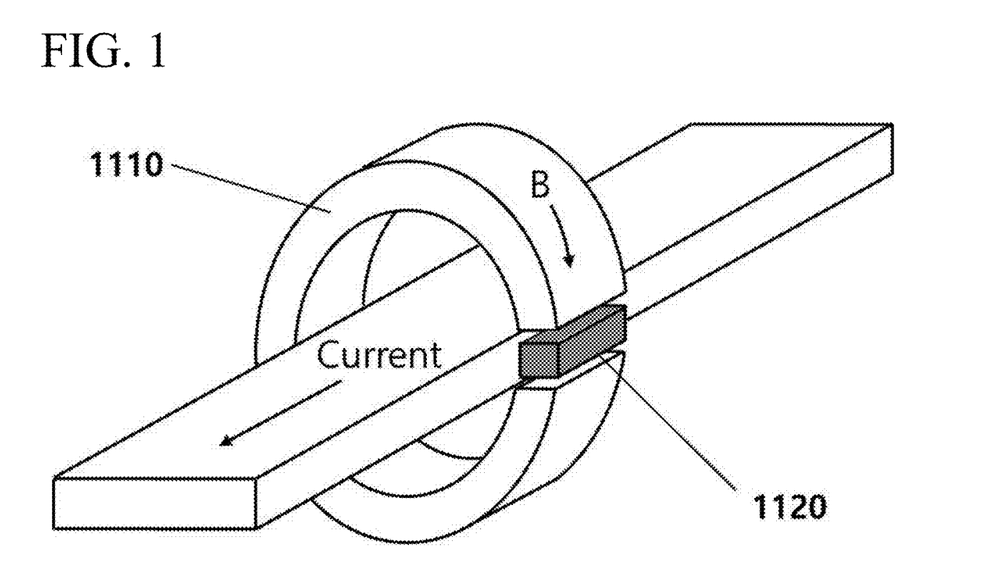
FIG. 1 illustrates an example of a current measurement element of a current measurement apparatus based on a hall element provided in an air gap of a magnetic core, to which the present invention is applied.

Among current measurement apparatuses, there is a hall sensor type current measurement apparatus having a hall element installed in an air gap of a C-shaped magnetic core to measure a voltage generated in the hall element, thereby detecting a strength of a magnetic field. FIG. 1 illustrates a current measurement element of the current measurement apparatus.

In the current measurement apparatus, the magnetic core is excited by a magnetomotive force generated by a current to be measured, and the hall element installed in the air gap of the magnetic core measures a magnetic flux density in the form of a voltage proportional to the current to be measured.

Figure 2A:
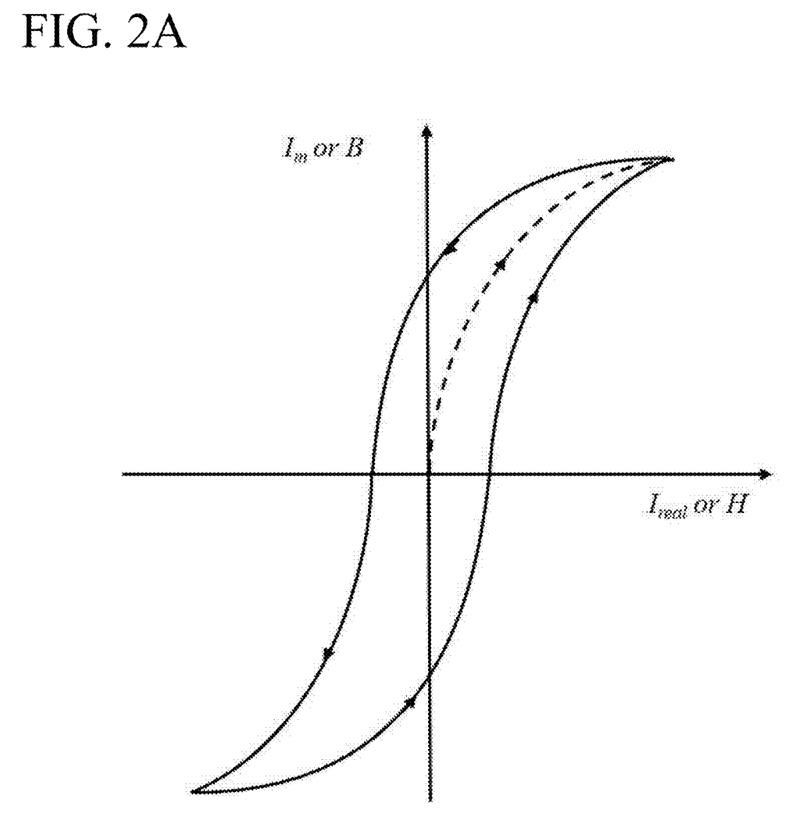
FIGS. 2A and 2B each illustrate an example of a relationship for a magnetic flux density Bh induced to the magnetic core by an actual current $I_{real}$ to be measured or for an amount of a non-corrected current to be measured Im.
Figure 2B:
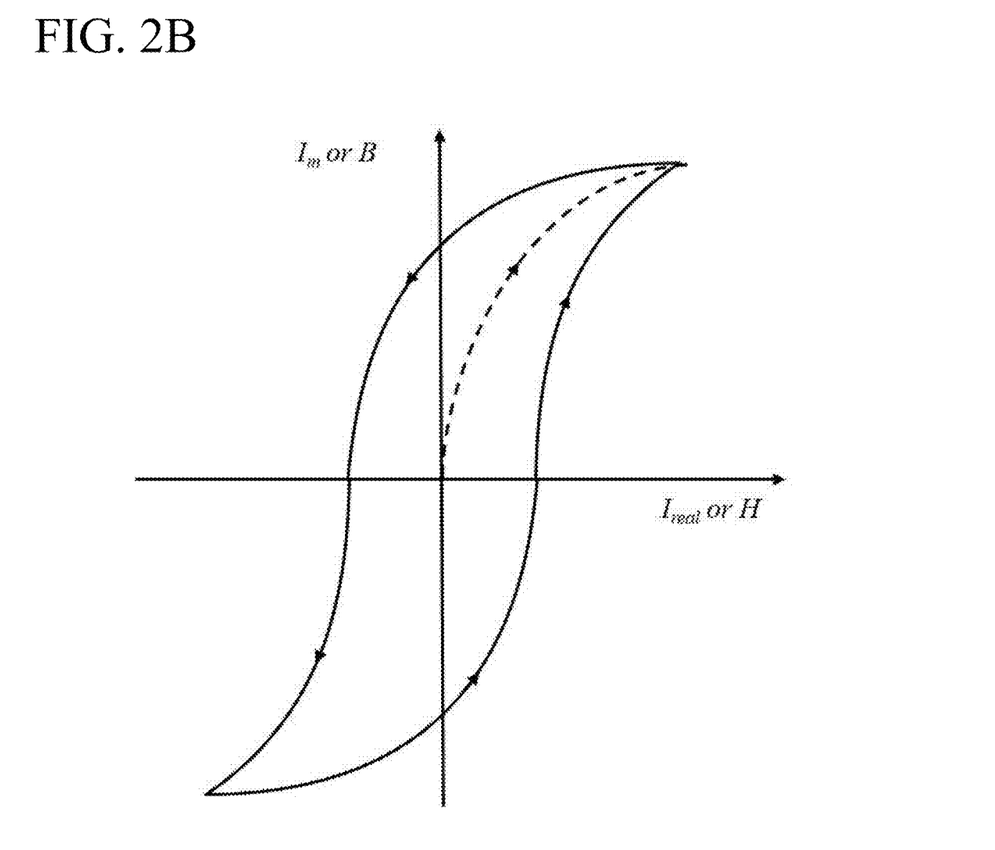

The magnetic core basically has hysteresis characteristics between the current to be measured and the magnetic flux density induced therefrom. FIGS. 2A and 2B each illustrate an example of a hysteresis characteristic curve of the magnetic core.

Conventionally, an amount of the current to be measured is measured from a voltage value outputted from the hall element using a simple circuit, with a problem in that it is not possible to reduce a current measurement error that occurs due to the hysteresis characteristics of the magnetic core.

SUMMARY

An embodiment of the present invention is directed to providing a current measurement apparatus including a measurement operation unit to correct a current measurement error that occurs due to hysteresis characteristics of a magnetic core from system information, thereby outputting a more accurate current measurement value than the conventional one.

In one general aspect, a current measurement apparatus includes: a current sensing element 1100 generating a signal according to a current to be measured; a current measurement means 1200 measuring an amount of the current to be measured Im from the signal outputted from the current sensing element 1100; a communication unit 1450 receiving system information from at least one upper-level controller 2000; a correction amount calculation unit 1430 calculating information on an amount of a corrected current Ic based on the amount of the current to be measured Im and the system information; and a measurement operation unit 1400 outputting the information on the amount of the corrected current Ic to the at least one upper-level controller 2000.

The current sensing element 1100 may include a magnetic core 1110 having an air gap defined by both end sides thereof facing each other; and a hall element 1120 installed in the air gap formed in the magnetic core 1110 to output a hall voltage by a hall effect.

The correction amount calculation unit 1430 may calculate a first corrected current Ic1 based on information on an amount of current applied to the hall element, information on a temperature of the current sensing element 1100, and information including at least one of a shape of the magnetic core 1110 and a size of the air gap; and a second corrected current Ic2 with a current measurement error that occurs due to hysteresis characteristics of the magnetic core 1110 being corrected based on at least one of the first corrected current Ic1 and the system information.

The system information may include system control information associated with the current to be measured.

The system control information may include information based on a fundamental wave component of the current to be measured.

The information based on the fundamental wave component of the current to be measured may be information based on a control command value of the current to be measured.

The information based on the fundamental wave component of the current to be measured may include at least one of a frequency and a magnitude of the fundamental wave component of the current to be measured.

The larger the magnitude of the fundamental wave component of the current to be measured obtained based on the system information is, the larger the magnitude of the second corrected current Ic2 may be. The smaller the magnitude of the fundamental wave component of the current to be measured obtained based on the system information is, the smaller the magnitude of the second corrected current Ic2 may be.

The higher the frequency of the fundamental wave component of the current to be measured obtained based on the system information is, the larger the magnitude of the second corrected current Ic2 may be. The lower the frequency of the fundamental wave component of the current to be measured obtained based on the system information is, the smaller the magnitude of the second corrected current Ic2 may be.

The system information may include information for determining whether the current to be measured is in a steady state or in a transient state. On the basis of the system information, the correction amount calculation unit 1430 may calculate the amount of the corrected current Ic based on the first corrected current Ic1 when the current to be measured is in the transient state, and may calculate the amount of the corrected current Ic based on the second corrected current Ic2 when the current to be measured is in the steady state.

When the current to be measured is changed from the steady state to the transient state or changed from the transient state to the steady state, the correction amount calculation unit 1430 may calculate the amount of the corrected current Ic based on a value between the first corrected current Ic1 and the second corrected current Ic2, for a predetermined time, so as to reduce a rapid change in the amount of the corrected current Ic.

In another general aspect, an electrical driving system includes: at least one current measurement apparatus described above; an inverter 10 applying a current through the current measurement apparatus 1000; and a motor 11 receiving the current from the inverter 10 through the current measurement apparatus 1000. A controller 12 of the inverter 10 may transmit the system information to the current measurement apparatus, and receive information on the current from the current measurement apparatus.

The system information may include information based on at least one of a torque, a torque control command, a velocity, a velocity control command, an angular velocity, and an angular velocity control command of the motor 11.

In another general aspect, an electrical driving moving body includes: the electrical driving system described above; and an accelerator pedal 20 and a brake pedal 21 controlling the electrical driving system. The system information may include information based on at least one of accelerator pedal signal (APS) information and brake pedal signal (BPS) information.

In another general aspect, a current measurement method includes: (a) generating, by a current sensing element 1100, a signal according to a current to be measured; (b) measuring, by a current measurement means 1200, an amount of the current to be measured Im from the signal outputted from the current sensing element 1100; (c) receiving, by a communication unit 1450, system information from at least one upper-level controller 2000; (d) calculating, by a correction amount calculation unit 1430, information on an amount of a corrected current Ic based on the amount of the current to be measured Im and the system information; and (e) outputting, by a measurement operation unit 1400, the information on the amount of the corrected current Ic.

Step (d) may include: (d1) calculating, by the correction amount calculation unit 1430, a first corrected current Ic1 based on information on an amount of current applied to the hall element included in the current sensing element 1100, information on a temperature of the current sensing element 1100, and information including at least one of a shape of the magnetic core 1110 included in the current sensing element 1100 and a size of the air gap in the magnetic core 1110 (S1); and (d2) calculating, by the correction amount calculation unit 1430, a second corrected current Ic2 with a current measurement error that occurs due to hysteresis characteristics of the magnetic core 1110 being corrected based on the first corrected current Ic1 and the system information.

Step (e) may include: (e1) determining, by the measurement operation unit 1400, whether the current to be measured is in a steady state or in a transient state based on the system information (S2); and (e2) calculating, by the measurement operation unit 1400, the amount of the corrected current Ic based on the first corrected current Ic1 when the current to be measured is in the transient state, or calculating, by the measurement operation unit 1400, the amount of the corrected current Ic based on the second corrected current Ic2 when the current to be measured is in the steady state (S7).

Step (d2) may include: (d2-1) determining, by the correction amount calculation unit 1430, whether a rate of change in a fundamental wave component of the current to be measured or a rate of change in a fundamental wave component of the first corrected current Ic1 is positive or negative (S4); (d2-2) setting, by the correction amount calculation unit 1430, a parameter tc for correcting the amount of current according to the following Equation 1 when the determination result is positive (S5-1), and setting, by the correction amount calculation unit 1430, a parameter tc for correcting the amount of current according to the following Equation 2 when the determination result is negative (S5-2); and (d2-3) calculating, by the correction amount calculation unit 1430, the second corrected current Ic2 according to the following Equation 3 based on the parameter (S6).

$$t_c = \frac{1}{\omega_f}\left(\sin^{-1}\left(\frac{I_{c1}}{I_{c1f}}\right) - \theta_f + \widetilde{\theta_f^-}\right) \qquad \text{[Equation 1]}$$

$$t_c = \frac{1}{\omega_f}\left(\pi - \sin^{-1}\left(\frac{I_{c1}}{I_{c1f}}\right) - \theta_f + \widetilde{\theta_f^-}\right) \qquad \text{[Equation 2]}$$

$$I_{c2} = I_{c1f} \sin \omega_f t_c \qquad \text{[Equation 3]}$$

Here, Ic1 may be an amount of the first corrected current that is corrected based on a first current correction amount, Ic1f may be a magnitude of the fundamental wave component of the first corrected current, $\omega_f$ may be an angular frequency of the fundamental wave component of the first corrected current, and $\theta_f$ may be a phase angle of the first corrected current.

In step (d2-2), $\widetilde{\theta_f^-}$ may be obtained from a lookup table based on the magnetization-dependent Preisach model for the characteristics of the magnetic core using a magnitude and an angular frequency of the fundamental wave component of the first corrected current.

Hereinafter, the present invention will be described in more detail through exemplary examples. However, the exemplary examples are only for illustrative purposes and are not intended to limit the present invention.

DETAILED DESCRIPTION OF MAIN ELEMENTS

1000: Current measurement apparatus
1100: Current sensing element
1110: Magnetic core
1120: Hall element
1200: Current measurement means
1211: Output voltage sensor
1212: First variable amplification means
1213: First A/D converter
1221: Input voltage sensor
1222: Second variable amplification means
1223: Second A/D converter
1300: Current source
1400: Measurement operation unit
1410: Processor
1420: Temperature calculation unit 1430: Correction amount calculation unit
1440: Memory device
1450: Communication unit
2000: Upper-level controller

DETAILED DESCRIPTION OF EMBODIMENTS

The above-described objects, features, and advantages of the present invention will be more apparent from the following exemplary embodiments, which will be described with reference to the accompanying drawings.

The specific structural and functional descriptions disclosed herein are merely exemplary for the purpose of describing the exemplary embodiments according to the concept of the present invention. The exemplary embodiments according to the concept of the present invention may be implemented in various forms and should not be construed as being limited to the exemplary embodiments set forth in the present specification or application.

While the exemplary embodiments according to the concept of the present invention may be modified variously and may have various forms, the specific exemplary embodiments will be illustrated in the drawings and described in detail in the present specification or application. However, it should be understood that the exemplary embodiments according to the concept of the present invention are not limited to the particular forms disclosed herein, but are intended to cover all modifications, equivalents, and alternatives falling within the spirit and technical scope of the present invention.

The terms "first", "second", and/or the like may be used herein to describe various elements, but the elements are not limited by the terms. The terms are merely used to distinguish one element from another element. For example, a first element may be referred to as a second element without departing from the scope according to the concept of the present invention, and similarly, the second element may also be referred to as the first element.

When a certain element is described as being connected or coupled to another element, although the certain element may be directly connected or coupled to the other element, it should be understood that another intervening element may exist therebetween. On the other hand, when a certain element is described as being directly connected or directly coupled to another element, it should be understood that no intervening element exists therebetween. Other expressions for describing a relationship between elements, i.e. "between", "directly between", "adjacent to", "directly adjacent to", and the like, should also be construed in the same manner.

Terms used in the present specification are used only for describing specific exemplary embodiments, and are not intended to limit the present invention. Singular forms include plural forms unless the context clearly indicates otherwise. It should be further understood that term "include" or "have" used in the present specification specifies the presence of features, numerals, steps, operations, elements, parts, or combinations thereof mentioned previously in the specification, but does not preclude the presence or addition of one or more other features, numerals, steps, operations, elements, parts, or combinations thereof.

Unless defined otherwise, all terms used herein, including technical or scientific terms, have the same meaning as commonly understood by those having ordinary skill in the art to which the present invention pertains. Terms such as those defined in generally used dictionaries should be interpreted to have meanings consistent with the contextual meanings in the relevant art, and are not to be interpreted to have ideal or excessively formal meanings unless clearly defined in the present specification.

Hereinafter, the present invention will be described in detail by describing preferred embodiments of the present invention with reference to the accompanying drawings. Identical reference marks shown in each drawing are used to denote identical elements.

As illustrated in FIG. 1, the present invention relates to a non-contact current measurement apparatus including a magnetic core 1110 and a hole element 1120 in an air gap between both end sides of the magnetic core 1110 facing each other.

FIGS. 2A and 2B each illustrate an example of a relationship for a magnetic flux density Bh induced to the magnetic core by an actual current $I_{real}$ to be measured or for an amount of a non-corrected current to be measured Im.

As illustrated in FIG. 2A, in an ideal case where there are no hysteresis characteristics in the magnetic core, the magnetic flux density Bh for the actual current $I_{real}$ to be measured or the amount of the non-corrected current to be measured Im is expressed as a straight line (not shown). However, a magnetic core such as ferrite exhibits hysteresis characteristics depending on a frequency of a current to be measured, and a difference between a broken line and a graph represented by an unbroken line in FIG. 2B is ultimately a current measurement error. The error is greater when the frequency is high than when the frequency is low.

The object of the present invention is to minimize the current measurement error caused by the hysteresis characteristics of the magnetic core as described above by using system information.

First Exemplary Embodiment

Figure 3:
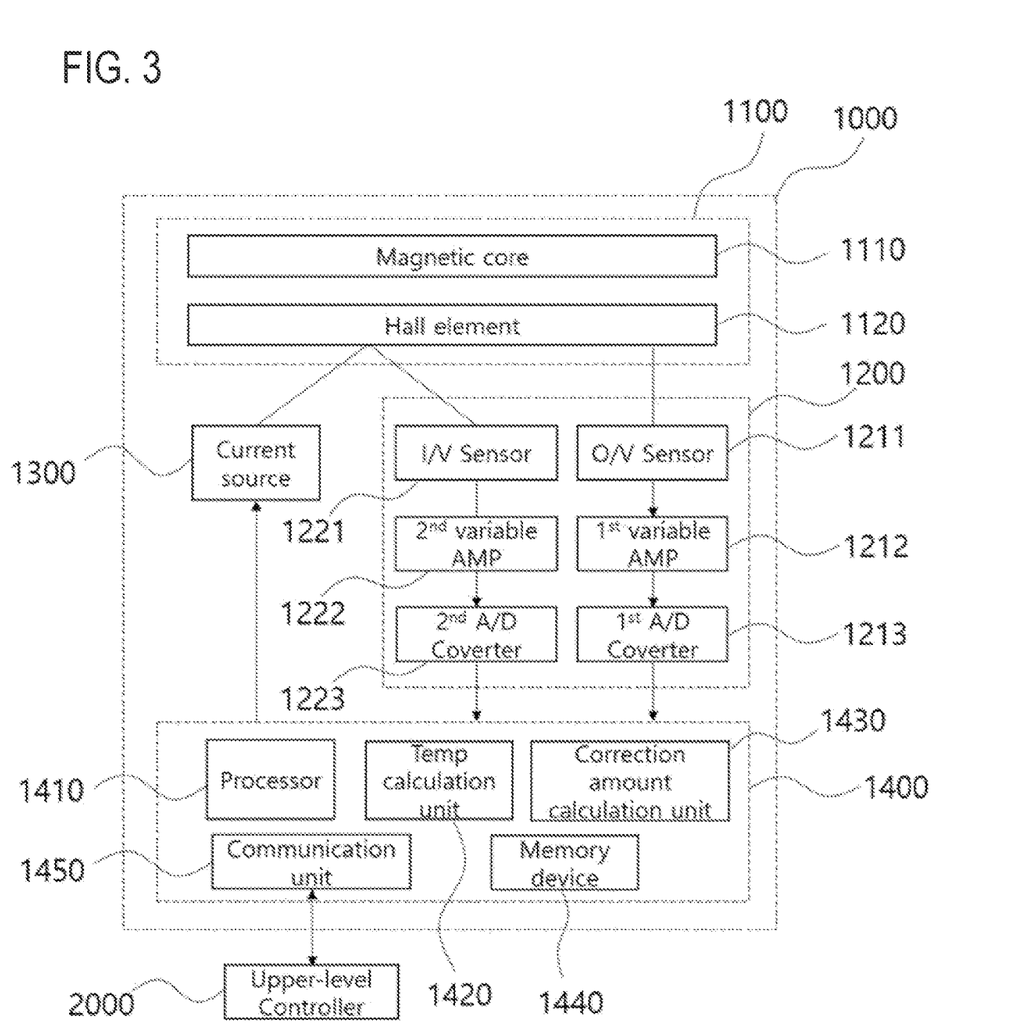
FIG. 3 illustrates a configuration of a current measurement apparatus according to the present invention.

As illustrated in FIG. 3, the present invention includes: a current sensing element 1100 generating a signal according to a current to be measured; a current measurement means 1200 measuring an amount of the current to be measured Im from the signal outputted from the current sensing element 1100; a communication unit 1450 receiving system information from at least one upper-level controller; a correction amount calculation unit 1430 calculating information on an amount of a corrected current Ic based on the amount of the current to be measured Im and the system information; and a measurement operation unit 1400 outputting the information on the amount of the corrected current Ic to the at least one upper-level controller.

The current sensing element 1100 may include a magnetic core 1110 having an air gap defined by both end sides thereof facing each other, and a hall element 1120 installed in the air gap formed in the magnetic core 1110 to output a hall voltage by a hall effect.

The correction amount calculation unit 1430 may calculate a first corrected current Ic1 based on information on an amount of current applied to the hall element, information on a temperature of the current sensing element 1100, and information including at least one of a shape of the magnetic core 1110 and a size of the air gap, and a second corrected current Ic2 with a current measurement error that occurs due to hysteresis characteristics of the magnetic core 1110 being corrected based on at least one of the first corrected current Ic1 and the system information.

Based on the above-described feature, it is possible to reduce a non-linear current measurement error that occurs depending on a magnitude or a frequency of the current to be measured.

Based on the above-described feature, it is also possible to reduce a complex current measurement error caused by the amount of current applied to the hall element, the temperature of the current sensing element 1100, and at least one of the shape of the magnetic core 1110 and the size of the air gap.

Here, the information on the temperature of the current sensing element may be based on an output value of a temperature sensor.

Also, the information on the temperature of the current sensing element may be based on a temperature of the hall element estimated by measuring a current and a voltage applied to the hall element of the current sensing element and calculating a resistance in the hall element.

Based on the above-described feature, even when the current sensing element is separated from a control operation unit, it is possible to make a correction in consideration of the temperature of the current sensing element.

The system information may include system control information associated with the current to be measured.

The system control information may include information based on a fundamental wave component of the current to be measured.

The information based on the fundamental wave component of the current to be measured may be information including at least one of a frequency and a magnitude of the fundamental wave component of the current to be measured.

Based on the correction of the current measurement error based on the system information having the above-described features, it is possible to further reduce the non-linear current measurement error that occurs depending on the magnitude or frequency of the current to be measured.

Here, as one of the grounds on which the current measurement error can be further reduced, it is advantageous in terms of noise reduction and time response to use a control command value of the system controlling the current to be measured, when compared to an estimated value of the fundamental wave component of the current to be measured that is extracted from the measured information on the current to be measured.

Further, the larger the magnitude of the fundamental wave component of the current to be measured obtained based on the system information, the larger the magnitude of the second corrected current Ic2, while the smaller the magnitude of the fundamental wave component of the current to be measured obtained based on the system information, the smaller the magnitude of the second corrected current Ic2.

In addition, the higher the frequency of the fundamental wave component of the current to be measured obtained based on the system information, the larger the magnitude of the second corrected current Ic2, while the lower the frequency of the fundamental wave component of the current to be measured obtained based on the system information, the smaller the magnitude of the second corrected current Ic2.

Here, the magnitude of the fundamental wave component of the current to be measured refers to a peak magnitude of a sinusoidal signal. For example, if the fundamental wave component of the current to be measured is A×sin (ωt), A is a magnitude of the fundamental wave component, ω is an angular frequency of the fundamental wave component of the current to be measured, and ω/2π is a frequency of the fundamental wave component of the current to be measured.

The system control information may include information for determining whether the current to be measured is in a steady state or in a transient state. Based on the system control information, the correction amount calculation unit 1430 may calculate the amount of the corrected current Ic based on the first corrected current Ic1 when the current to be measured is in the transient state, and calculate the amount of the corrected current Ic based on the second corrected current Ic2 when the current to be measured is in the steady state.

Based on the above-described feature, the current measurement apparatus may determine whether the current is in the steady state or in the transient state by itself. As a result, it is possible to simplify the system and increase reliability.

Based on the feature in which the system information is used, it is possible to accurately determine the state of the current to be measured even in an environment where there is a lot of noise.

When the current to be measured is changed from the steady state to the transient state or changed from the transient state to the steady state, the correction amount calculation unit 1430 may calculate the amount of the corrected current Ic based on a value between the first corrected current Ic1 and the second corrected current Ic2, for a predetermined time, in order to reduce a rapid change in the amount of the corrected current Ic.

Based on the above-described feature, it is possible to prevent deterioration in system stability due to a rapid change in outputting the corrected current at the time of transition between the steady state and the transient state of the current to be measured.

When the current to be measured is changed from the steady state to the transient state, the amount of the corrected current is outputted while being changed in a stepwise way over time for the predetermined time from the amount of the corrected current when the current to be measured is in the steady state to the amount of the corrected current when the current to be measured is in the transient state. When the current to be measured is changed from the transient state to the steady state, the amount of the corrected current is outputted while being changed in a stepwise way over time for the predetermined time from the amount of the corrected current when the current to be measured is in the transient state to the amount of the corrected current when the current to be measured is in the steady state.

In addition, the predetermined time is a variable time interval, which may vary depending on a changed magnitude of the current to be measured.

Based on the above-described feature, it is possible to prevent deterioration in system stability by changing a filtering period and a filtering degree in outputting the corrected current at the time of transition between the steady state and the transient state according to the change of the current to be measured.

Second Exemplary Embodiment

Figure 5:
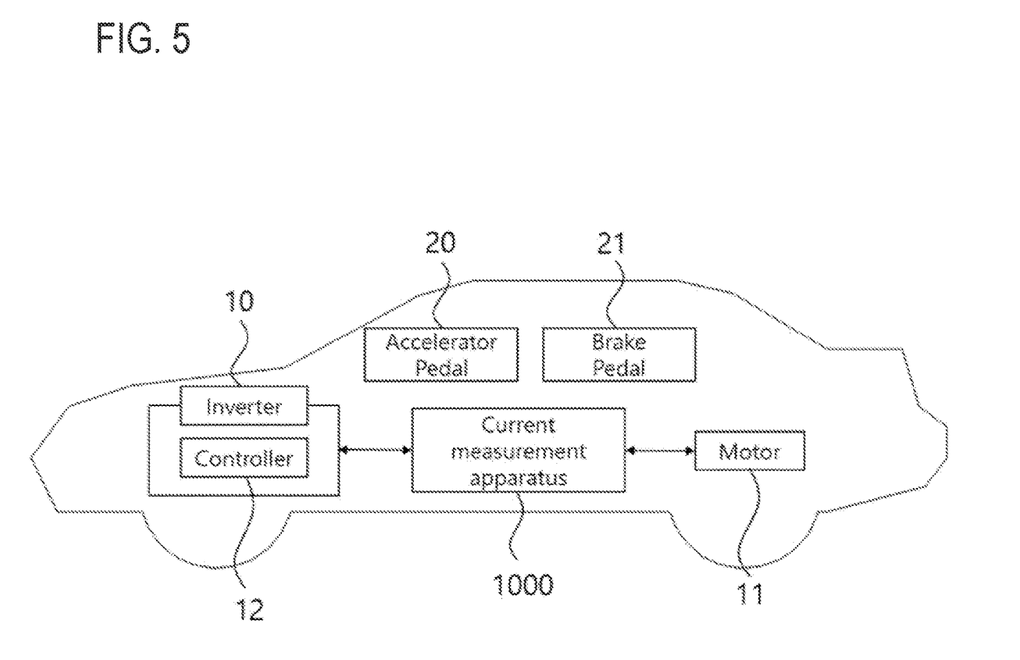
FIG. 5 illustrates an electrical driving moving body includes an accelerator pedal and a brake pedal controlling the electrical driving system.

An electrical driving system includes an inverter 10 applying a current through the current measurement apparatus 1000, and a motor 11 receiving the current from the inverter 10 through the current measurement apparatus 1000. A controller 12 of the inverter 10 may transmit the system information to the current measurement apparatus, and receive information on the current from the current measurement apparatus.

The system information may include information based on at least one of a torque, a torque control command, a velocity, a velocity control command, an angular velocity, and an angular velocity control command of the motor 11.

Third Exemplary Embodiment

An electrical driving moving body includes an accelerator pedal 20 and a brake pedal 21 controlling the electrical driving system. The system information may include information based on at least one of accelerator pedal signal (APS) information and brake pedal signal (BPS) information.

Fourth Exemplary Embodiment

Figure 4:
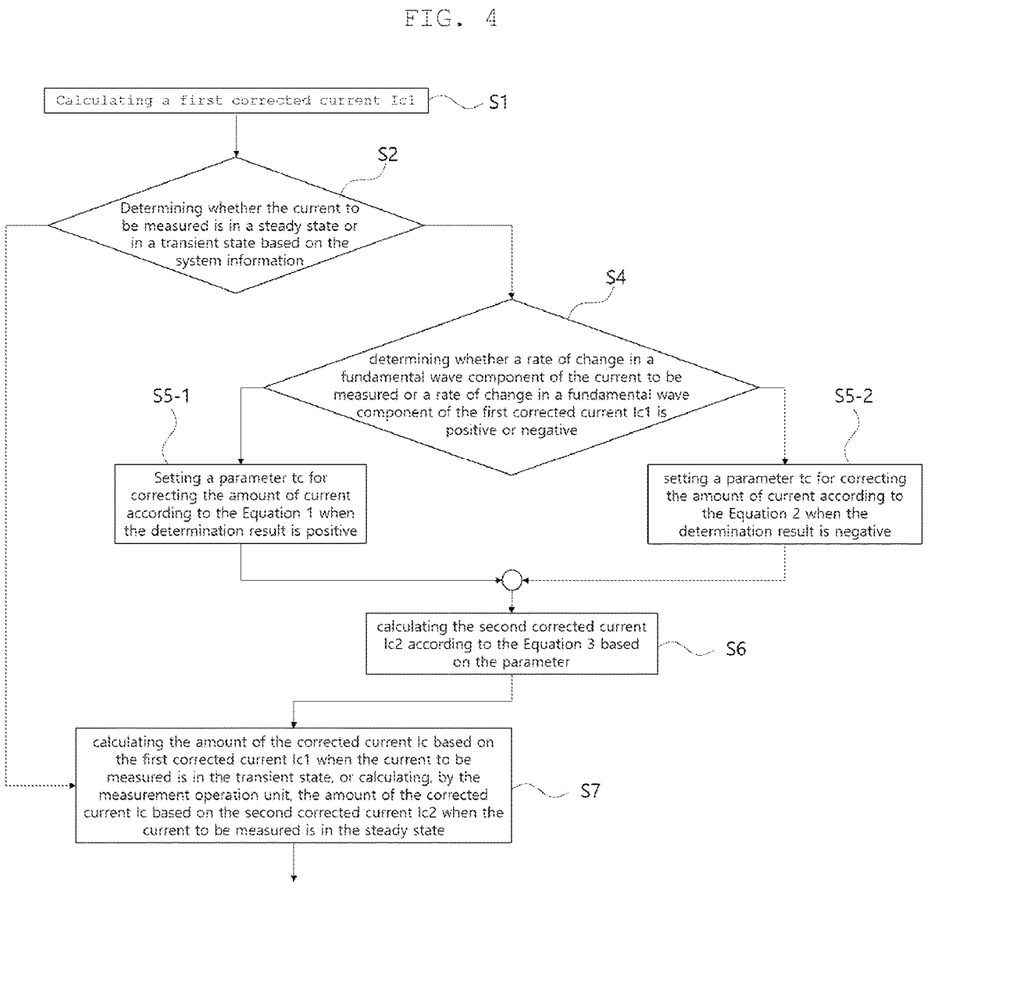
FIG. 4 illustrates a signal flow chart of a current measurement method according to the present invention.

A current measurement method includes: (a) generating, by a current sensing element 1100, a signal according to a current to be measured; (b) measuring, by a current measurement means 1200, an amount of the current to be measured Im from the signal outputted from the current sensing element 1100; (c) receiving, by a communication unit 1450, system information from at least one upper-level controller; (d) calculating, by a correction amount calculation unit 1430, information on an amount of a corrected current Ic based on the amount of the current to be measured Im and the system information; and (e) outputting, by a measurement operation unit 1400, the information on the amount of the corrected current Ic.

Step (d) may include: (d1) calculating, by the correction amount calculation unit 1430, a first corrected current Ic1 based on information on an amount of current applied to the hall element included in the current sensing element 1100, information on a temperature of the current sensing element 1100, and information including at least one of a shape of the magnetic core 1110 included in the current sensing element 1100 and a size of the air gap in the magnetic core 1110 (S1); and (d2) calculating, by the correction amount calculation unit 1430, a second corrected current Ic2 with a current measurement error that occurs due to hysteresis characteristics of the magnetic core 1110 being corrected based on the first corrected current Ic1 and the system information.

Step (e) may include: (e1) determining, by the measurement operation unit 1400, whether the current to be measured is in a steady state or in a transient state based on the system information (S2); and (e2) calculating, by the measurement operation unit 1400, the amount of the corrected current Ic based on the first corrected current Ic1 when the current to be measured is in the transient state, or calculating, by the measurement operation unit 1400, the amount of the corrected current Ic based on the second corrected current Ic2 when the current to be measured is in the steady state (S7).

Step (d2) may include: (d2-1) determining, by the correction amount calculation unit 1430, whether a rate of change in a fundamental wave component of the current to be measured or a rate of change in a fundamental wave component of the first corrected current Ic1 is positive or negative (S4); (d2-2) setting, by the correction amount calculation unit 1430, a parameter tc for correcting the amount of current according to the following Equation 1 when the determination result is positive (S5-1), and setting, by the correction amount calculation unit 1430, a parameter tc for correcting the amount of current according to the following Equation 2 when the determination result is negative (S5-2); and (d2-3) calculating, by the correction amount calculation unit 1430, the second corrected current Ic2 according to the following Equation 3 based on the parameter (S6).

$$t_c = \frac{1}{\omega_f}\left(\sin^{-1}\left(\frac{I_{c1}}{I_{c1f}}\right) - \theta_f + \overline{\overline{\theta_f}}\right)$$ [Equation 1]

$$t_c = \frac{1}{\omega_f}\left(\pi - \sin^{-1}\left(\frac{I_{c1}}{I_{c1f}}\right) - \theta_f + \overline{\overline{\theta_f}}\right)$$ [Equation 2]

$$I_{c2} = I_{c1f} \sin \omega_f t_c$$ [Equation 3]

$\overline{\overline{\theta_f}}$ may be obtained from a lookup table based on the magnetization-dependent Preisach model for the characteristics of the magnetic core using a magnitude and an angular frequency of the fundamental wave component of the first corrected current.

As described above, the present invention has the following effects:

(1) it is possible to reduce a current measurement error;
(2) it is possible to reduce a non-linear current measurement error that occurs depending on the magnitude or frequency of the current to be measured;
(3) it is possible to reduce a non-linear current measurement error that occurs depending on the magnitude or frequency of the fundamental wave component of the current to be measured;
(4) if the current to be measured is changed abruptly, it is possible to prevent the current measurement error from being increased by improper correction;
(5) it is possible to prevent deterioration in system stability due to a rapid change in outputting the corrected current at the time of transition between the steady state and the transient state of the current to be measured;
(6) it is possible to improve both accuracy and stability of the current measurement system in that the corrected amount is calculated using the system information, not based on the measured current to be measured, thereby preventing an occurrence of correction errors caused by measurement noise or deterioration in system stability; and
(7) it is possible to prevent deterioration in system stability by changing a filtering period and a filtering degree in outputting the corrected current at the time of transition between the steady state and the transient state depending on the state of the system.

The current measurement apparatus 1000 includes a current source 1300. The current measurement means 1200 includes an Output voltage sensor 1211, a first variable amplification means 1212, First A/D converter 1213, an Input voltage sensor 1221, a second variable amplification means 1222 and a second A/D converter 1223. The measurement operation unit 1400 includes a processor 1410 and a memory device 1440.

Although the present invention has been described with reference to the exemplary embodiments illustrated in the accompanying drawings, those are merely examples. Those skilled in the art will understand that various modifications and equivalent other embodiments are possible therefrom. Therefore, the true scope of the present invention should be determined by the technical idea of the appended claims.

The invention claimed is:

1. A current measurement apparatus comprising:
a current sensing element generating a signal according to a current to be measured;
a current measurement means measuring an amount of the current to be measured from the signal outputted from the current sensing element;
a communication unit receiving system information from at least one upper-level controller;

a correction amount calculation unit calculating information on an amount of a corrected current based on the amount of the current to be measured and the system information; and a measurement operation unit outputting the information on the amount of the corrected current to the at least one upper-level controller, wherein the current sensing element includes:
- a magnetic core having an air gap defined by both end sides thereof facing each other; and
- a hall element installed in the air gap formed in the magnetic core to output a hall voltage by a hall effect, and wherein the correction amount calculation unit calculates:
- a first corrected current based on information on an amount of current applied to the hall element, information on a temperature of the current sensing element, and information including at least one of a shape of the magnetic core and a size of the air gap; and
- a second corrected current with a current measurement error that occurs due to hysteresis characteristics of the magnetic core being corrected based on at least one of the first corrected current and the system information.

2. The current measurement apparatus of claim 1, wherein the system information includes system control information associated with the current to be measured.

3. The current measurement apparatus of claim 2, wherein the system control information includes information based on a fundamental wave component of the current to be measured.

4. The current measurement apparatus of claim 3, wherein the information based on the fundamental wave component of the current to be measured is information based on a control command value of the current to be measured.

5. The current measurement apparatus of claim 3, wherein the information based on the fundamental wave component of the current to be measured includes at least one of a frequency and a magnitude of the fundamental wave component of the current to be measured.

6. The current measurement apparatus of claim 3, wherein the second corrected current is calculated based on a lookup table in which the hysteresis characteristics are reflected using the amount of the current to be measured and the system information.

7. The current measurement apparatus of claim 1, wherein the system information includes information for determining whether the current to be measured is in a steady state or in a transient state, and on the basis of the system information, the correction amount calculation unit calculates the amount of the corrected current based on the first corrected current when the current to be measured is in the transient state, and calculates the amount of the corrected current based on the second corrected current when the current to be measured is in the steady state.

8. The current measurement apparatus of claim 7, wherein when the current to be measured is changed from the steady state to the transient state or changed from the transient state to the steady state, the correction amount calculation unit calculates the amount of the corrected current based on a value between the first corrected current and the second corrected current for a predetermined time so as to reduce a rapid change in the amount of the corrected current.

9. An electrical driving system comprising:
the current measurement apparatus of claim 3;
an inverter applying a current through the current measurement apparatus; and
a motor receiving the current from the inverter through the current measurement apparatus,
wherein a controller of the inverter transmits the system information to the current measurement apparatus, and receives information on the current from the current measurement apparatus.

10. The electrical driving system of claim 9, wherein the system information includes information based on at least one of a torque, a torque control command, a velocity, a velocity control command, an angular velocity, and an angular velocity control command of the motor.

11. An electrical driving moving body comprising:
the electrical driving system of claim 9; and
an accelerator pedal and a brake pedal controlling the electrical driving system,
wherein the system information includes information based on at least one of accelerator pedal signal (APS) information and brake pedal signal (BPS) information.

12. A current measurement method comprising:
(a) generating, by a current sensing element, a signal according to a current to be measured;
(b) measuring, by a current measurement means, an amount of the current to be measured from the signal outputted from the current sensing element;
(c) receiving, by a communication unit, system information from at least one upper-level controller;
(d) calculating, by a correction amount calculation unit, information on an amount of a corrected current based on the amount of the current to be measured and the system information, wherein step (d) includes:
  (d1) calculating, by the correction amount calculation unit, a first corrected current based on information on an amount of current applied to the hall element included in the current sensing element, information on a temperature of the current sensing element, and information including at least one of a shape of the magnetic core included in the current sensing element and a size of the air gap in the magnetic core; and
  (d2) calculating, by the correction amount calculation unit, a second corrected current with a current measurement error that occurs due to hysteresis characteristics of the magnetic core being corrected based on the first corrected current and the system information; and
(e) outputting, by a measurement operation unit, the information on the amount of the corrected current.

13. The current measurement method of claim 12, wherein step (e) includes:
(e1) determining, by the measurement operation unit, whether the current to be measured is in a steady state or in a transient state based on the system information; and
(e2) calculating, by the measurement operation unit, the amount of the corrected current based on the first corrected current when the current to be measured is in the transient state, or calculating, by the measurement operation unit, the amount of the corrected current based on the second corrected current when the current to be measured is in the steady state.

* * * * *